United States Patent
Harada et al.

(10) Patent No.: US 8,277,693 B2
(45) Date of Patent: Oct. 2, 2012

(54) METHOD FOR PRODUCING FINE PARTICLE DISPERSION AND FINE PARTICLE DISPERSION

(75) Inventors: Takuya Harada, Tokyo (JP); Hidemichi Fujiwara, Tokyo (JP); Kazuhiro Takashiba, Tokyo (JP); Nobumitsu Yamanaka, Tokyo (JP); Yusuke Yamada, Tokyo (JP); Hideo Nishikubo, Tokyo (JP); Takashi Unno, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 628 days.

(21) Appl. No.: 12/309,739

(22) PCT Filed: Jul. 25, 2007

(86) PCT No.: PCT/JP2007/064575
§ 371 (c)(1),
(2), (4) Date: May 21, 2009

(87) PCT Pub. No.: WO2008/013198
PCT Pub. Date: Jan. 31, 2008

(65) Prior Publication Data
US 2009/0321689 A1    Dec. 31, 2009

(30) Foreign Application Priority Data

| Jul. 28, 2006 | (JP) | ................................ 2006-205984 |
| Nov. 9, 2006 | (JP) | ................................ 2006-304360 |
| Mar. 22, 2007 | (JP) | ................................ 2007-074950 |
| Jun. 26, 2007 | (JP) | ................................ 2007-167286 |

(51) Int. Cl.
*H01B 1/02* (2006.01)
*H01B 1/12* (2006.01)

(52) U.S. Cl. .................. 252/519.2; 252/500; 106/31.92; 428/325

(58) Field of Classification Search .................. 252/500, 252/519.2; 257/773; 427/180; 524/439; 106/31.92; 428/325
See application file for complete search history.

(56) References Cited

U.S. PATENT DOCUMENTS

| 2004/0197549 A1* | 10/2004 | Inokuma et al. ............. 428/325 |
| 2006/0163744 A1* | 7/2006 | Vanheusden et al. ......... 257/773 |
| 2006/0211802 A1* | 9/2006 | Asgari ......................... 524/439 |
| 2007/0098883 A1* | 5/2007 | Itoh et al. ..................... 427/180 |

FOREIGN PATENT DOCUMENTS

| JP | 2004-277627 | 10/2004 |
| JP | 2004-323568 | 11/2004 |
| JP | 2005-081501 | 3/2005 |
| JP | 2005-330552 | 12/2005 |

* cited by examiner

*Primary Examiner* — Khanh Tuan Nguyen
(74) *Attorney, Agent, or Firm* — Kubotera & Associates, LLC

(57) ABSTRACT

A method for producing a fine particle dispersion includes the steps of reducing a metal ion to form a fine particle dispersion aqueous solution; adding an aggregation accelerator into the fine particle dispersion aqueous solution so that agglomerated or precipitated fine particles are separated to obtain fine particles; and re-dispersing the fine particles into an organic solvent containing an organic solvent having an amide group, a low boiling point organic solvent having a boiling point between 20° C. and 100° C. at a normal pressure, and an organic solvent having a boiling point higher than 100° C. at a normal pressure and containing an alcohol and/or a polyhydric alcohol.

6 Claims, No Drawings

METHOD FOR PRODUCING FINE PARTICLE DISPERSION AND FINE PARTICLE DISPERSION

TECHNICAL FIELD

The present invention relates to a method for producing a fine particle dispersion and the fine particle dispersion obtained by such the method, wherein fine particles comprised of one type or not less than two types of a metal, an alloy, and a metallic compound, are dispersed in a predetermined organic solvent, thereby obtaining superior dispersibility, storage stability, or the like.

Entire contents of (1) Japanese Patent Application No. 2006-205984 patent applied on the twenty-eighth of Jul., 2006, (2) Japanese Patent Application No. 2006-304360 patent applied on the ninth of Nov., 2006, (3) Japanese Patent Application No. 2007-074950 patent applied on the twenty-second of Mar., 2007, and (4) Japanese Patent Application No. 2007-167286 patent applied on the twenty-sixth of Jun., 2007, that are basic applications of the present application, are expressly incorporated in the present application as reference documents to be a part of the present specification.

BACKGROUND ART

It is known that a fine particle of metal (particle diameter of not larger than 1 μm) has a variety of specific characteristics which a bulk material does not have. Currently, the fine particle is greatly expected on a variety of technological applications with making the best use of such the characteristics, in individual fields, such as electronics, bio, energy, or the like.

Regarding a method for producing such the fine particle of metal having a nanometer size, it is known that there are two producing methods, i.e., a vapor phase synthesis method and a liquid phase synthesis method. The vapor phase synthesis method is a method to form a fine particle of metal as a solid state from a metal vapor introduced into a vapor phase. The liquid phase synthesis method is a method to precipitate a fine particle of metal by reducing a metal ion dispersed into a solution. In the liquid phase synthesis method, it is known in general that there are two methods, i.e., a method with using a reducing agent for reducing such the metal ion and a method to perform a reduction electrochemically on a cathode electrode.

The fine particle dispersion, in which the fine particles are dispersed into an aqueous solution or an organic solvent, is widely used for an application such as ink-jet ink, an etching resist, a solder resist, a dielectric substance pattern, an electrode (electrically conductive circuit) pattern, a wiring pattern in an electronic component, an electrically conductive paste, an electrically conductive ink, an electrically conductive film, or the like.

In recent years, an attention is focused on a technology that a wiring pattern is formed using an ink-jet method with ink containing a fine particle of metal and then a wiring is formed by baking thereof. However, in a case of using the ink containing the fine particle of metal for the ink-jet, it is important to retain dispersibility in the ink for a long period of time. Accordingly, a method for producing a fine particle of metal is proposed to retain the dispersibility for a long period of time in the ink.

Moreover, a method for producing a metal fine particle dispersion and a method for obtaining a metallic thin film or a thin metallic wire include a step of coating such the metal fine dispersion, and then baking after drying thereof, and are disclosed in patent documents as mentioned below.

According to patent document 1, regarding a method for obtaining a fine particle of copper, there is disclosed an electrically conductive thin film of copper to be formed by forming a fine particle of copper having a particle diameter of not larger than 50 nm containing palladium in a polyethylene glycol solution or an ethylene glycol solution by adding a palladium ion for nucleation with adding polyethyleneimine as a dispersing agent, by performing a pattern print onto a substrate using such the copper fine particle dispersion after a solvent displacement to ethanol and ethyl lactate, and then by performing a heat treatment therefor in an atmospheric current of 4% $H_2$—$N_2$ for approximately three hours at a temperature of 250° C.

According to patent document 2, there is disclosed ink for ink-jet by collecting a fine particle of cuprous oxide using a centrifugal separator, which has a primary particle diameter of not larger than 100 nm and is obtained by reducing with heating copper acetate in diethylene glycol, and then by re-dispersing it into a mixed solution comprised of polyethylene glycol and diethylene glycol, and disclosed a pattern of a metal wiring to be obtained by coating it onto a substrate using such the ink-jet method, and then by performing a reduction of cuprous oxide by performing a heat treatment therefor in nitrogen gaseous atmosphere for approximately one hour at a temperature of 350° C.

According to patent document 3, there is disclosed a thin film of silver by coating a nano particle of metal onto a substrate (a glass) using a spin coat method, on which an organic metal compound as a dispersing agent is attached to around the metal, by drying it at a temperature of 100° C., and then by baking it at a temperature of 250° C.

Furthermore, according to patent document 4, there is disclosed a thin film of copper by concentrating cuprous oxide for becoming to be a concentration of 30% by weight, which is suspended into diethylehe glycol, in which secondary particles have a mean particle diameter of 500 nm, by performing further a ultrasonic wave treatment therefor to be an electrically conductive ink, by coating it onto a slide glass, and then by heating it in a reducing atmosphere for approximately one hour at a temperature of 350° C.

[Patent Document 1] Japanese Patent Application Publication No. 2005-330552

[Patent Document 2] Japanese Patent Application Publication No. 2004-277627

[Patent Document 3] Japanese Patent Application Publication No. 2005-081501

[Patent Document 4] Japanese Patent Application Publication No. 2004-323568

DISCLOSURE OF THE INVENTION

Problems to be Solved by the Invention

According to the conventional producing method disclosed in the patent documents 1 and 2, in addition to the patent document 3 and the patent document 4, there is a problem that it is not able to obtain a metal member of electrically conductive unless an organic metal compound is attached as a dispersing agent to around a metal particle, a heat treatment is performed at a relatively high temperature of 350° C. approximately, or it is performed in a reducing gaseous atmosphere, such as hydrogen gas or the like, for a process of a heat treatment.

Means for Solving the Problem

With regard to the above mentioned conventional problems, the present inventors have examined deeply for obtaining a fine particle dispersion, which is superior in dispersibility of fine particles of metal or the like, and superior in electrical conductivity and substrate adherence by performing at a relatively lower baking temperature without a necessity of reducing gaseous atmosphere. As a result, it is found out that it is able to obtain a fine particle dispersion, which is superior in dispersibility and storage stability, and superior in electrical conductivity, substrate adherence, or the like, in a case of producing a metallic thin film or a thin metallic wire by baking thereof, by removing an impurity such as a polymer dispersing agent, a reducing agent, or the like, by separating and collecting such the fine particles from an aqueous solution as to be agglomerated or precipitated therein by adding an aggregation accelerator after finishing a reductive reaction under an existence of the polymer dispersing agent in the aqueous solution, and then dispersing such the fine particles of metal or the like into a predetermined mixed organic solvent containing an organic solvent having an amide group, or into an alcohol solvent. It is able to complete the present invention hereby.

According to a first aspect of the present invention, (1) a method for producing a fine particle dispersion, in which fine particles (P) comprised of one type or not less than two types of a metal, an alloy, and a metallic compound, having a mean particle diameter of between 1 nm and 150 nm for primary particles, are dispersed in an organic solvent, comprising at least one of the following steps of:

(a) Process 1: reducing at least one type of a metal ion by an electrolytic reduction or an electroless reduction using a reducing agent in an aqueous solution wherein the metal ion and a polymer dispersing agent (D) for improving dispersibility of the fine particles are dissolved, and forming thereby a fine particle dispersion aqueous solution, in which fine particles (Pc) comprised of one type or not less than two types of the metal, the alloy, or the metallic compound, having the mean particle diameter of between 1 nm and 150 nm for the primary particles are dispersed with being coated by the polymer dispersing agent (D);

(b) Process 2: adding an aggregation accelerator (F) into the aqueous solution obtained in the Process 1 wherein the fine particles (Pc) are dispersed, and agitating the aqueous solution for agglomerating or precipitating the fine particles to separate the fine particles thus agglomerated or precipitated from the aqueous solution, thereby obtaining the fine particles (P) comprised of one type or not less than two types of the metal, the alloy, and the metallic compound; and (c) Process 3: re-dispersing the fine particles (P) obtained in the Process 2 into:

(i) an organic solvent (S1) which contains at least an organic solvent (A) as between 5% and 90% by volume having an amide group, a low boiling point organic solvent (B) as between 5% and 45% by volume having a boiling point of between 20° C. and 100° C. at a normal pressure, and an organic solvent (C) as between 5 and 90% by volume having a boiling point of higher than 100° C. at a normal pressure and comprised of an alcohol and/or a polyhydric alcohol having one or not less than two hydroxyl groups in a molecule thereof;

(ii) an organic solvent (S2) which contains at least the organic solvent (A) as between 5% and 95% by volume having the amide group, and the organic solvent (C) as between 5% and 95% by volume having the boiling point of higher than 100° C. at the normal pressure and comprised of the alcohol and/or the polyhydric alcohol having the one or not less than the two hydroxyl groups in the molecule thereof; or (iii) the organic solvent (C) having the boiling point of higher than 100° C. at the normal pressure and comprised of the alcohol and/or the polyhydric alcohol having the one or not less than the two hydroxyl groups in the molecule thereof, so that the fine particle dispersion wherein the fine particles (P) are dispersed into the organic solvent is obtained.

In the method for producing the fine particle dispersion according to the first aspect, the following aspects (2) to (7) may be adopted.

(2) The polymer dispersing agent (D) is one type or not less than two types selected from polyvinylpyrrolidone, polyethyleneimine, polyacrylic acid, carboxymethylcellulose, polyacrylamide, polyvinyl alcohol, polyethylene oxide, starch, and gelatin.

(3) The metal ion in the Process 1 is a metal ion of one type or not less than two types of metals selected from copper, silver, gold, nickel, cobalt, iron, zinc, tin, aluminum, bismuth, platinum, rhodium, palladium, ruthenium, manganese, chromium, vanadium, and titanium.

(4) The Process 2 comprises the steps of: after adding the aggregation accelerator (F) into the aqueous solution obtained in the Process 1 in which the fine particles (Pc) are dispersed, and agitating the aqueous solution for agglomerating or precipitating the fine particles, (i) washing the fine particles thus agglomerated or precipitated using a cleaning solvent (W) to separate and collect the fine particles, or (ii) washing and collecting the fine particles thus agglomerated or precipitated using the cleaning solvent (W) after separating and collecting the fine particles, for obtaining the fine particles (P) comprised of one type or not less than two types of the metal, the alloy, and the metallic compound from which the polymer dispersing agent (D) is removed, till a weight ratio of (D/P) between the polymer dispersing agent (D) coating a surface of the fine particle (P) and the fine particles (P) becomes to be less than 0.001 at the most.

(5) The aggregation accelerator (F) in the Process 2 is one type or not less than two types selected from methyl chloride, methylene chloride, chloroform, carbon tetrachloride, ethyl chloride, 1,1-dichloroethane, 1,2-dichloroethane, 1,1-dichloroethylene, 1,2-dichloroethylene, trichloroethylene, acetylene tetrachloride, ethylene chlorohydrin, 1,2-dichloropropane, allyl chloride, chloroprene, chlorobenzene, benzyl chloride, o-dichlorobenzene, m-dichlorobenzene, p-dichlorobenzene, α-chlornaphthalin, β-chlornaphthalin, bromoform, and bromobenzene.

(6) The cleaning solvent (W) in the Process 2 is water and/or an alcohol or a polyhydric alcohol having at least one hydroxyl group in a molecule with a carbon number of between one and six.

(7) The organic solvent (A) in the Process 3 is one type or not less than two types selected from N-methylacetamide, N-methylformamide, N-methylpropanamide, formamide, N,N-dimethylacetamide, 1,3-dimethyl-2-imidazolidinone, N,N-dimethylformamide, 1-methyl-2-pyrolidone, hexamethylphosphorictriamide, 2-pyrrolidinone, ε-caprolactam, and acetamide.

(8) The organic solvent (B) in the Process 3 is one type or not less than two types selected from an ether based compound (B1) expressed by a general form $R^1$—O—$R^2$ ($R^1$ and $R^2$ are alkyl groups individually having a carbon number between one and four respectively), an alcohol (B2) expressed by a general form $R^3$—OH ($R^3$ is an alkyl group having a carbon number between one and four), a ketone based compound (B3) expressed by a general form $R^4$—C(=O)—$R^5$ ($R^4$ and $R^5$ are alkyl groups individually having a carbon number one or two respectively), and an amine based compound (B4) expressed by a general form $R^6$—(N—$R^7$)—$R^8$ ($R^6$, $R^7$ and $R^8$ are alkyl groups or a hydrogen atom individually having a carbon number between zero and two respectively).

(9) The organic solvent (B) in the Process 3 is the ether based compound (B1) of one type or not less than two types selected from diethyl ether, methyl propyl ether, dipropyl ether, diisopropyl ether, methyl-t-butyl ether, t-amyl methyl ether, divinyl ether, ethyl vinyl ether and aryl ether, the alcohol (B2) of one type or not less than two types selected from methanol, ethanol, 1-propanol, 2-propanol, 2-butanol and 2-methyl-2-propanol, the ketone based compound (B3) of one type or not less than two types selected from acetone, methyl ethyl ketone and diethyl ketone, and/or the amine based compound (B4) as triethylamine and/or diethylamine.

(10) The organic solvent (C) in the Process 3 is one type or not less than two types selected from ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, threitol, erythritol, pentaerythritol, pentitol, and hexitol.

(11) An ultrasonic wave is irradiated in the Process 3 at a period of re-dispersing the fine particles (P) comprised of one type or not less than two types of the metal, the alloy, and the metallic compound, into the organic solvent (S1), the organic solvent (S2), or the organic solvent (C).

(12) The metal is one type or not less than two types selected from copper, silver, gold, nickel, cobalt, iron, zinc, tin, aluminum, bismuth, platinum, rhodium, palladium, ruthenium, manganese, chromium, vanadium and titanium, the alloy is an alloy comprised of not less than two types of the metals, and the metallic compound is an oxide of the metal and the alloy.

Moreover, the present invention is to provide a fine particle dispersion (hereinafter, referred to as a second aspect as well) which is characterized in that:

(13) The fine particle dispersion, in which fine particles (P) comprised of one type or not less than two types of a metal, an alloy, and a metallic compound, having a mean particle diameter of between 1 nm and 150 nm for primary particles, are dispersed in an organic solvent, wherein a weight ratio of (D/P) between a polymer dispersing agent (D) coating a surface of the fine particle (P) and the fine particles (P) in the dispersion is less than 0.001, and the organic solvent is one of:

(i) an organic solvent (S1) which contains at least an organic solvent (A) having an amide group as between 5% and 90% by volume, a low boiling point organic solvent (B) having a boiling point of between 20° C. and 100° C. at a normal pressure as between 5% and 45% by volume, and an organic solvent (C) having a boiling point of higher than 100° C. at a normal pressure and comprised of an alcohol and/or a polyhydric alcohol having one or not less than two hydroxyl groups in a molecule thereof as between 5% and 90% by volume;

(ii) an organic solvent (S2) which contains at least the organic solvent (A) having the amide group as between 5% and 95% by volume, and the organic solvent (C) having the boiling point of higher than 100° C. at the normal pressure and comprised of the alcohol and/or the polyhydric alcohol having the one or not less than the two hydroxyl groups in the molecule thereof as between 5% and 95% by volume; or (iii) the organic solvent (C) having the boiling point of higher than 100° C. at the normal pressure and comprised of the alcohol and/or the polyhydric alcohol having the one or not less than the two hydroxyl groups in the molecule thereof.

In the fine particle dispersion according to the second aspect, the following aspects (14) to (18) may be adopted.

(14) The polymer dispersing agent (D) is one type or not less than two types selected from polyvinylpyrrolidone, polyethyleneimine, polyacrylic acid, carboxymethylcellulose, polyacrylamide, polyvinyl alcohol, polyethylene oxide, starch, and gelatin.

(15) The organic solvent (A) is one type or not less than two types selected from N-methylacetamide, N-methylformamide, N-methylpropanamide, formamide, N,N-dimethylacetamide, 1,3-dimethyl-2-imidazolidinone, N,N-dimethylformamide, 1-methyl-2-pyrolidone, hexamethylphosphorictriamide, 2-pyrrolidinone, ϵ-caprolactam, and acetamide.

(16) The organic solvent (B) is one type or not less than two types selected from an ether based compound (B1) expressed by a general form $R^1$—O—$R^2$ ($R^1$ and $R^2$ are alkyl groups individually having a carbon number between one and four respectively), an alcohol (B2) expressed by a general form $R^3$—OH ($R^3$ is an alkyl group having a carbon number between one and four), a ketone based compound (B3) expressed by a general form $R^4$—C(=O)—$R^5$ ($R^4$ and $R^5$ are alkyl groups individually having a carbon number one or two respectively), and an amine based compound (B4) expressed by a general form $R^6$—(N—$R^7$)—$R^8$ ($R^6$, $R^7$ and $R^8$ are alkyl groups or a hydrogen atoms individually having a carbon number between zero and two respectively).

(17) The organic solvent (C) is one type or not less than two types selected from ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, threitol, erythritol, pentaerythritol, pentitol, and hexitol.

(18) The metal is one type or not less than two types selected from copper, silver, gold, nickel, cobalt, iron, zinc, tin, aluminum, bismuth, platinum, rhodium, palladium, ruthenium, a manganese, chromium, vanadium, and titanium, the alloy is an alloy comprised of not less than two types of the metals, and the metallic compound is an oxide of the metal and the alloy.

Hereinafter, the metal, the alloy, and the metallic compound are combined and referred to as a metal or the like as well, regarding the fine particles comprised of one type or not less than two types of the metal, the alloy, and the metallic compound according to the present invention. Moreover, a fine particle of metal or the like is referred to as a fine particle (Pc) as well, which is formed from a reductive reaction aqueous solution at Process 1, a fine particle of metal or the like performed a treatment of removing the polymer dispersing agent (D) is referred to as a fine particle (P) as well, and referred to as a fine particle without distinguishing the fine particle (Pc) from the fine particle (P).

Further, the organic solvent (A) having the amide group is referred to as an organic solvent (A), the low boiling point organic solvent (B) having the boiling point of between 20° C. and 100° C. at the normal pressure is referred to as an organic solvent (B), the organic solvent (C) having the boiling point of higher than 100° C. at the normal pressure and comprised of the alcohol and/or the polyhydric alcohol having one or not less than two hydroxyl groups in the molecule thereof is referred to as an organic solvent (C), and the organic solvent (S1), the organic solvent (S2) and the organic solvent (C) are combined and referred to as an organic solvent or the like according to the present invention in a case of obtaining a fine particle dispersion by dispersing the fine particles (P) into an organic solvent, respectively.

Effects of the Invention

According to the method for producing the fine particle dispersion regarding the present invention, the fine particle (Pc) is produced by the liquid phase reductive reaction under the existence of the polymer dispersing agent (D) for improving the dispersibility of fine particles in an aqueous solution, and then separated and collected by agglomerating or precipitating the fine particles in the aqueous solution, with adding the aggregation accelerator (F) after finishing such the reductive reaction, by which the polymer dispersing agent (D) is not precipitated. Therefore, it becomes able to collect the fine particles (P), with which an impurity of such as the polymer dispersing agent (D) or the like is efficiently removed. Moreover, it is not required to use a reducing gaseous atmosphere in a case of drying and baking the fine particle dispersion after arranging onto a substrate using an ink-jet method, which is obtained by re-dispersing the fine particles (P) collected in such a way into the organic solvent or the like according to the present invention (the organic solvent (S1), the organic solvent (S2) or the organic solvent (C)). Further, it becomes able to obtain a metallic thin film, a thin metallic wire, or the like, which is superior in electrical conductivity and substrate adherence even in a case of baking thereof at a relatively lower temperature.

Still further, according to the method for producing the fine particle dispersion regarding the present invention, it becomes able to obtain the fine particle (P) which is superior in dispersibility, dispersion efficiency, storage stability, re-dispersibility after agglomerating thereof, because of using the above mentioned organic solvent (S1), the organic solvent (S2) or the organic solvent (C) as the organic solvent for re-dispersing the fine particles (P). Furthermore, it becomes able to prevent from jamming a fine particle metal at an ink-jet head, because it is superior in dispersibility and storage stability in a case of using the fine particle dispersion according to the present invention as an ink composition for the ink-jet.

BEST MODE FOR CARRYING OUT THE INVENTION

1. A First Embodiment According to the Method for Producing the Fine Particle Dispersion (1) Regarding a method for producing a fine particle dispersion (hereinafter, referred to as a method according to the present invention as well), the method for producing the fine particle dispersion as the first embodiment according to the present invention is characterized in that:

A method for producing a fine particle dispersion, in which fine particles (P) comprised of one type or not less than two types of a metal, an alloy, and a metallic compound, having a mean particle diameter of between 1 nm and 150 nm for primary particles, are dispersed in an organic solvent includes at least one of (a) Process 1 to (c) Process 3:

(a) Process 1: reducing at least one type of a metal ion by an electrolytic reduction or an electroless reduction using a reducing agent in an aqueous solution wherein such the metal ion and a polymer dispersing agent (D) for improving a dispersibility of the fine particles are dissolved, and forming thereby a fine particle dispersion aqueous solution, in which fine particles (Pc) comprised of one type or not less than two types of the metal, the alloy, and the metallic compound, having the mean particle diameter of between 1 nm and 150 nm for the primary particles are dispersed with being coated by the polymer dispersing agent (D).

(b) Process 2: adding an aggregation accelerator (F) into the fine particle dispersion aqueous solution obtained in the Process 1 wherein the fine particles (Pc) are dispersed, the resulting solution is agitated for agglomerating or precipitating the fine particles, and then the agglomerated or precipitated fine particles are separated from the aqueous solution, thereby obtaining fine particles (P) comprised of one type or not less than two types the metal, the alloy and the metallic compound.

(C) Process 3: re-dispersing the fine particles (P) obtained in the Process 2 into:

(i) an organic solvent (S1) which contains at least an organic solvent (A) as between 5% and 90% by volume having one amide group, a low boiling point organic solvent (B) as between 5% and 45% by volume having a boiling point of between 20° C. and 100° C. at a normal pressure, and an organic solvent (C) as between 5% and 90% by volume having a boiling point of higher than 100° C. at a normal pressure and comprised of an alcohol and/or a polyhydric alcohol having one or not less than two hydroxyl groups in a molecule thereof;

(ii) an organic solvent (S2) which contains at least the organic solvent (A) as between 5% and 95% by volume having the one amide group, and the organic solvent (C) as between 5% and 95% by volume having the boiling point of higher than 100° C. at the normal pressure and comprised of the alcohol and/or the polyhydric alcohol having the one or not less than the two hydroxyl groups in the molecule thereof; or (iii) the organic solvent (C) having the boiling point of higher than 100° C. at the normal pressure and comprised of the alcohol and/or the polyhydric alcohol having the one or not less than the two hydroxyl groups in the molecule thereof, for obtaining the fine particle dispersion wherein the fine particles (P) are dispersed into the organic solvent.

The above mentioned method according to the present invention is particularly characterized in that such the fine particles (P) are to be re-dispersed into the organic solvent or the like according to the present invention which is superior in dispersibility, by removing an impurity of such as the polymer dispersing agent (D) or the like from the fine particle (Pc) comprised of one type or not less than two types of the metal, the alloy, and the metallic compound, which is obtained by the liquid phase reduction of the metal ion under the existence of the polymer dispersing agent (D) in the aqueous solution. Hereinafter, the metal, the alloy, the metallic compound, and Process 1 through Process 3 regarding the method according to the present invention will be described in detail below.

(2) Regarding the Metal, the Alloy and the Metallic Compound

There is no limitation in particular regarding the metal, the alloy and the metallic compound that are available to use for the present invention, and it is possible to select properly depending on the intended use. For example, it is possible to select from any one type or not less than two types of metals selected from copper, silver, gold, nickel, cobalt, iron, zinc, tin, aluminum, bismuth, platinum, rhodium, palladium, ruthenium, manganese, chromium, vanadium titanium, or the like, an alloy comprised of not less than two types of such the metals, and a metallic compound of any one type or not less than two types of such the metals.

Moreover, the above mentioned metallic compound includes an oxide of a metal and of an alloy as well. In most of the cases of producing the fine particle according to the present invention, there is included the oxide of the metal and of the alloy. In particular, it can be said that there is few member which does not include such the oxide at all in a case of a transition metal particle, such as copper or the like. An oxidation level in such a case is various depending on an atmosphere at a period of generating a fine particle and of storing it, on a temperature thereof, and on a time of retaining thereof. And then sometimes there is a case where an inside thereof is still retaining the metal state while just a most surface thereof is oxidized thinly, or there is a case where the fine particle is almost oxidized. Thus, the metallic compound according to the present invention includes a particle of such the various oxidation state.

Regarding the above mentioned metals, it is preferable to use a metal select from any one type or not less than two types of metals selected from Cu, Ag, Au, or the like, or an alloy comprised of not less than two types of such the metals.

(3) Regarding Process 1 to Process 3

(a) Process 1:

Process 1 is a process comprising the steps of: reducing at least one type of a metal ion by an electrolytic reduction or an electroless reduction using a reducing agent in an aqueous solution wherein such the metal ion and a polymer dispersing agent (D) for improving a dispersibility of the fine particles are dissolved; and forming thereby a fine particle dispersion aqueous solution, in which fine particles (Pc) comprised of one type or not less than two types of the metal, the alloy, and the metallic compound, having the mean particle diameter of between 1 nm and 150 nm for the primary particles are dispersed with being coated by the polymer dispersing agent (D).

Regarding the liquid phase reduction, such as the above mentioned electrolytic reduction or the electroless reduction using the reducing agent, it is able to adopt either one of the electrolytic reduction or the electroless reduction as far as it is able to form the fine particles (Pc) having the mean particle diameter of between 1 nm and 150 nm for the primary particles, and it is able to adopt a heretofore known method regarding a method for such the electrolytic reduction and the electroless reduction. And then by such the liquid phase reduction, the fine particle (Pc) becomes to be formed, wherein a surface thereof is coated by the polymer dispersing agent (D) and it is dispersed in an aqueous solution.

(a-1) Regarding the Metal Ion

At least one type of the metal ion to be used at Process 1 is a metal ion of the above mentioned metal.

There is no limitation in particular regarding the metal salt to form the above mentioned metal ion. However, it is able to provide a metal ion as example therefor, such as a chloride salt, a nitrate salt, a nitrite salt, a sulfate salt, an ammonium salt, an acetate salt, or the like.

(a-2) Regarding the Polymer Dispersing Agent (D)

According to the present invention, the polymer dispersing agent (D) is used in the case of forming the fine particle (Pc) comprised of one type or not less than two types of the metal, the alloy and the metallic compound by reducing at least one type of a metal ion in a liquid phase.

The polymer dispersing agent (D) has a solubility for water, and has a function to maintain in good condition the dispersibility with preventing from agglomerating the fine particle of metal or the like by existing with like coating a surface of the fine particle comprised of the metal or the like precipitated in a reaction system.

Regarding the polymer dispersing agent (D), it is available to use any member as far as a molecular weight thereof is between 100 and 100,000, though it depends on a chemical structure thereof, has a solubility y for water, and it is possible to disperse in good condition a fine particle of metal or the like precipitated by a reductive reaction from a metal ion in an aqueous solution.

It is preferable for the polymer dispersing agent (D) to be as any one type or not less than two types selected from: a polymer of an amine system, such as polyvinylpyrrolidone, polyethyleneimine, or the like; a polymer of a hydrocarbon system having a carboxylic acid function, such as polyacrylic acid, carboxymethylcellulose, or the like; acrylamide, such as polyacrylamide or the like; polyvinyl alcohol; polyethylene oxide; starch; and gelatin.

As examples for the above exemplary mentioned polymer dispersing agent (D), it is able to provide such as polyvinylpyrrolidone (the molecular weight: 1,000 to 500,000), polyethyleneimine (the molecular weight: 100 to 100,000), carboxymethylcellulose (substitution degree from a hydroxyl group Na salt to a carboxymetyl group regarding an alkali cellulose: not less than 0.4, the molecular weight: 1,000 to 100,000), polyacrylamide (the molecular weight: 100 to 6,000,000), polyvinyl alcohol (the molecular weight: 1,000 to 100,000), polyethylene glycol (the molecular weight: 100 to 50,000), polyethylene oxide (the molecular weight: 50,000 to 900,000), gelatin (a mean molecular weight: 61,000 to 67,000) and a water soluble starch.

The number-average molecular weight of the polymer dispersing agent (D) are shown in the above expressed parentheses respectively. Moreover, a member within a range of such the molecular weight has water solubility, and then it is able to use preferably for the present invention. Further, it is able to use with mixing not less than two types thereof as well.

Furthermore, it is desirable for an adding amount of the polymer dispersing agent (D) to be as between 1 and 5,000 weight unit for the fine particles of such the metal or the like as 100 weight unit, though it depends on a concentration of the fine particle of metal or the like produced from the reactive reaction aqueous solution, and then it is more preferable to be as between 5 and 1,000 weight unit. The reason is that there is a case where it is not able to obtain sufficiently an effect to suppress the agglomeration in a case where the adding amount of the polymer dispersing agent (D) is less than the above mentioned weight unit of one, meanwhile, in a case where it is more than the above mentioned weight unit of 5000, there is a case where an inconvenience may occurs in a case of removing the polymer dispersing agent (D) by adding an aggregation accelerator after finishing the reductive reaction.

(a-3) Regarding the Electrolytic Reduction, and the Electroless Reduction using the Reducing Agent In a case of the electrolytic reduction, the fine particle (Pc) is formed, wherein a surface thereof is coated with the polymer dispersing agent (D), in the vicinity of a cathode by applying an electric potential between an anode and the cathode provided in an aqueous solution containing a metal ion. While, as examples for the reducing agent to be used in a case of the electroless reduction, it is able to provide such as sodium borohydride, hydrazine, dimethylaminoborane, trimethylaminoborane, or the like. And then it is able to use together with not less than two types therefrom as well. Moreover, the fine particle (Pc) is formed, wherein the surface thereof is coated with the polymer dispersing agent (D), by the heretofore known liquid phase reduction using the above mentioned reducing agent.

Furthermore, for a liquid phase reduction aqueous solution, a hydrophilic solution may be mixed as a reaction solvent as well.

(a-4) Regarding the Mean Particle Diameter of the Primary Particles for the Fine Particle (P)

The mean particle diameter of the primary particle for the fine particle (Pc) produced by the liquid phase reduction of the above mentioned metal ion is between 1 nm and 150 nm. Here, the mean particle diameter of the primary particles means a diameter of the primary particle for individual fine particles of metal or the like comprising a secondary particle. It is able to measure such the primary particle diameter using an electron microscope. Moreover, the mean particle diameter means a number-average particle diameter of the primary particles. And then the mean particle diameter of the primary particles for the fine particle (P) is between 1 nm and 150 nm, however, it is preferable to use fine particles (P) having the diameter of between 1 nm and 100 nm from viewpoint for practice, such as manufacturing, handling, or the like.

Furthermore, it is possible to perform a control of the mean particle diameter of the primary particles for the fine particle (P) by adjusting a type and a mixing concentration of the metal ion, polymer dispersing agent (D) and the reducing agent, and by adjusting such as an agitation speed, a temperature, a time, a pH, or the like, in a case of reductive reacting the metal ion. More specifically, in a case of electroless liquid phase reduction for example, it is possible to obtain fine particles of copper having a mean particle diameter of the primary particles as 100 nm in a case of reducing a metal ion (a cupric acetate or the like) using sodium borohydride under the existence of polyvinylpyrrolidone (PVP, the number-average molecular weight of 3500 approximately) at a reduction temperature of approximately 80° C. in an aqueous solution.

(a-5) Regarding the Liquid Phase Reduction

According to the fine particle (Pc) regarding the present invention, it is able to improve a dispersion stability of a fine particle of metal or the like, by reducing a metal ion in an aqueous solution where the polymer dispersing agent (D) is dissolved therein, and then by forming a fine particle of the metal or the like. Here, in the aqueous solution where the polymer dispersing agent (D) is dissolved therein, according to the present invention, normally means to add a metal ion and a reducing agent into a reaction system where the polymer dispersing agent (D) according to the present invention is dissolved therein beforehand. However, it may also available to perform a reductive reaction by dissolving the polymer dispersing agent (D), the metal ion and the reducing agent into an aqueous solution in a different container individually, and then by adding each thereof into another reaction container. Moreover, the polymer dispersing agent (D) according to the present invention has advantages to improve the dispersion stability of the fine particle of metal or the like, and to improve a yield of a production for the fine particle of metal or the like. And then it is desirable for the polymer dispersing agent (D) to exist in the reaction system at a period of or immediately after forming the fine particle (Pc).

(b) Process 2:

Process 2 is a process comprising the steps of: adding an aggregation accelerator (F) into the fine particle dispersion aqueous solution obtained in Process 1 wherein the fine particles (Pc) are dispersed, the resulting solution is agitated for agglomerating or precipitating such the fine particles, and then such the agglomerated or precipitated fine particles are separated from the aqueous solution, thereby obtaining fine particles (P) comprised of one type or not less than two types of the metal, the alloy and the metallic compound.

(b-1) Regarding the Agglomeration or the Precipitation of the Fine Particles by Adding the Aggregation Accelerator (F)

The aggregation accelerator (F) to be used at Process 2 has an advantage to reduce a dispersion function of the polymer dispersing agent (D) in an aqueous liquid. And then as exemplary mentioned below, it is desirable to have a lower solubility for water and to be a liquid state at a normal temperature or an operating temperature. Moreover, regarding the aggregation accelerator (F) of gaseous state and having a function to agglomerate or precipitate (hereinafter, the agglomeration or the precipitation is simply referred to as the agglomeration as well) a fine particle by blowing it into an aqueous solution, it is available to use such the gaseous type at a normal temperature or an operating temperature.

Further, it is desirable for the aggregation accelerator (F), in a case of adding it into an aqueous solution after finishing the reductive reaction for agglomerating or precipitating fine particles and then of separating and collecting the fine particles from the aqueous solution, to be not for precipitating the polymer dispersing agent (D) and not for precipitating it as a solid state. Thus, it becomes able to separate and collect efficiently the fine particles from the aqueous solution by using such the aggregation accelerator (F).

Conventionally, it is known as the operations that a reductive reaction is performed in an aqueous solution using a dispersing agent having a higher solubility for an alkaline aqueous solution, a pH is adjusted to be neutral after finishing the reductive reaction, the dispersing agent is precipitated and collected with the particles, and then a solvent displacement is performed. On the contrary, the present invention is characterized in that the aggregation accelerator (F) is used, which has the functions to agglomerate or precipitate fine particles by reducing extremely the dispersion function of the polymer dispersing agent (D) without precipitating the polymer dispersing agent (D) in an aqueous liquid. Moreover, it becomes possible to remove easily the polymer dispersing agent (D) from the fine particles (Pc) by using the aggregation accelerator (F) according to the present invention at Process 2. Further, it becomes possible to remove easily an unreacted reducing agent and a by-product in the reaction or the like of a reducing agent in a case of using the reducing agent in an electroless reaction.

There is no limitation in particular regarding the aggregation accelerator (F) to be able to use for the present invention as far as it is a liquid state or a gaseous state at a normal temperature or an operating temperature, it is for agglomerating or precipitating fine particles but not for precipitating the polymer dispersing agent (D) by adding it into an aqueous solution after finishing a reductive reaction. However, it is able to provide as a preferable example, such as a halide based hydrocarbon or the like. And then it is desirable for such the halide based hydrocarbon to be as a halogenated compound, such as a chlorine compound having the number of carbon atom as between one and four, a bromine compound, or the like, a halide based aromatic compound, such as a chloride system, a bromine system, or the like.

As examples therefor, it is able to exemplary mention at least one type selected from:

the chlorine compound having the number of carbon atom as one, such as methyl chloride ($CH_3Cl$), methylene chloride ($CH_2Cl_2$), chloroform ($CHCl_3$), carbon tetrachloride ($CCl_4$), or the like;

the chlorine compound having the number of carbon atoms as two, such as ethyl chloride ($C_2H_5Cl$), 1,1-dichloroethane ($C_2H_4Cl_2$), 1,2-dichloroethane ($C_2H_4Cl_2$), 1,1-dichloroethylene ($C_2H_2Cl_2$), 1,2-dichloroethylene ($C_2H_2Cl_2$), trichloroethylene ($C_2HCl_3$), acetylene tetrachloride ($C_2H_2Cl_4$), ethylene chlorohydrin (OH—$CH_2$—$CH_2Cl$), or the like;

the chlorine compound having the number of carbon atom as three, such as 1,2-dichloropropane ($CH_3CH_2ClCH_2Cl$), allyl chloride ($CH_2$=$CHCH_2OH$), or the like;

the chlorine compound having the number of carbon atom as four, such as chloroprene ($CH_2$=$CClCH$=$CH_2$) or the like;

a chloride based aromatic compound, such as chlorobenzene ($C_6H_5Cl$), benzyl chloride ($C_6H_5CH_2Cl$), o-dichlorobenzene ($C_6H_4Cl_2$), m-dichlorobenzene ($C_6H_4Cl_2$), p-dichlorobenzene ($C_6H_4Cl_2$), α-chloronaphthalene ($C_{10}H_7Cl$), β-chloronaphthalene ($C_{10}H_7Cl$), or the like; and the bromine compound, such as bromoform ($CHBr_3$), bromobenzole ($C_6H_5Br$), or the like.

Moreover, the aggregation accelerator (F) according to the present invention is not limited to the above mentioned chlorine based hydrocarbon, the bromine based hydrocarbon, a fluorine based hydrocarbon and an iodine based hydrocarbon. And, all others are also included in the aggregation accelerator (F) according to the present invention as far as it has the functions to agglomerate or precipitate fine particles by reducing the dispersion function of the polymer dispersing agent (D).

Further, it is desirable for an adding amount of the aggregation accelerator (F) to be not less than 0.01 as a ratio of (the aggregation accelerator (F) (mol)/the fine particles (P) (g)) for the fine particles formed by the reductive reaction. And then there is no limitation regarding the upper limit thereof, however, it is preferable to be as between 0.01 and 50, and it is further preferable to be as between 0.1 and 20. If the above mentioned mixing ratio is less than 0.01, an addition effect may not function sufficiently.

Still further, in the case of adding for example the chloroform, which has a specific gravity of heavier than water, as the aggregation accelerator (F) into the aqueous solution in which the fine particles (Pc) are dispersed at Process 2, and then of decantation after agitating therefor, the aqueous solution becomes to be separated into two phases as a top phase comprised of water and a bottom phase comprised of the aggregation accelerator (F). And then the fine particle exists as an agglomerated state at a lower part of the aqua phase as the upper phase. Furthermore, in a case where the aggregation accelerator (F) has a specific gravity of lighter than water, the upper phase becomes to be the aggregation accelerator (F) phase and the bottom phase becomes to be the aqua phase after the agitation. And then in such the case, the fine particle of metal may exist as the agglomerated state at the lower part of the aqua phase.

Therefore, it becomes able to remove efficiently the aggregation accelerator (F) from the fine particle (Pc), because the added aggregation accelerator (F) is separated from the aqueous solution by still standing therefor.

Moreover, according to Process 2, the agglomerated or precipitated state, after adding the aggregation accelerator (F) and then agitating therefor, includes a state where the fine particles are concentrated and floated at the lower part of the aqua phase.

Further, it is able to obtain remarkable effect in the case of using chloroform in particular among the above mentioned aggregation accelerators (F) that there is less chemical reaction on a surface of the fine particle of metal, and it is easy to desorb the polymer dispersing agent (D) from the fine particle (Pc).

Furthermore, it is able to wash a fine particle using a cleaning solvent (W) after separating the fine particle from an aqueous solution in a case where it is not able to remove sufficiently the polymer dispersing agent (D) from the fine particle (Pc) only by an operation of a separation and a collection, such as a filtration or the like, at the time of obtaining the fine particle (P) comprised of one type or not less than two types of the metal, the alloy, and the metallic compound, by separating such the fine particle, which is agglomerated or precipitated from the aqueous solution, by using the operation of such the filtration or the like, after adding the aggregation accelerators (F) into the aqueous solution and agitating therefor, in which the fine particles (Pc) obtained in Process 1 are dispersed, and then after agglomerating or precipitating such the particles.

(b-2) Regarding Washing and Collecting the Fine Particles that are Agglomerated or Precipitated It is able to obtain the fine particle (P) with removing sufficiently the aggregation accelerators (F) and another additive agent or the like, by separating and collecting or by washing with separating and collecting the above mentioned fine particle from the aqueous solution, which is agglomerated or the precipitated therein. Moreover, regarding an operation for the above mentioned separation and the collection of the fine particle from the aqueous solution, the separation and the collection are performed using such as a filtration operation, an operation of centrifugal separation, an operation to remove a supernatant liquid by a decantation, or the like. Further, it is desirable to perform the operation of washing with separating and collecting till a weight ratio of (D/P) between the polymer dispersing agent (D) coating a surface of the fine particle (P) and the fine particle (P) becomes to be less than 0.001 at the most.

As one example, (i) regarding an operation of washing and then collecting such the agglomerated or the precipitated fine particles using a cleaning solvent (W) with separating from the aqueous solution, it is able to collect the fine particle (P) by rinsing using the cleaning solvent (W) with supplying such the agglomerated or the precipitated fine particles to a centrifugal separator for example.

Moreover, (ii) regarding an operation of washing such the agglomerated or the precipitated fine particles using the cleaning solvent (W) after separating and collecting therefrom, it is able to collect the fine particle (P), by washing it using the cleaning solvent (W) after separating and collecting the fine particle by operating such as a filtration, a centrifugal separation or the like, and then by removing the cleaning solvent (W) thereafter by further operating such as the filtration, the centrifugal separation, or the like.

Regarding a preferable cleaning solvent (W) to be possible to use for such the washing, it is able to provide water and/or an alcohol or a polyhydric alcohol having at least one hydroxyl group in a molecule with a carbon number of between one and six.

Further, more preferable operation is to operate washing one to five times using water first, and then washing one to five times using the alcohol or the polyhydric alcohol having the carbon number of between one and six. Furthermore, it is able to perform such the washing processes continuously as well.

Thus, it becomes able to remove sufficiently by such the operation regarding the reducing agent used for the electroless reduction, the by-product of the reducing agent and the other added impurities with the aggregation accelerators (F).

Moreover, it is able to confirm that the weight ratio of (D/P) between the polymer dispersing agent (D) coating the surface of the fine particle (P) and the fine particle (P) is less than 0.001, by the following method of (i), (ii), or the like for example.

(i) Collecting the fine particle (P) obtained in Process 2 as a sample for analysis, performing a preparation of a solution wherein a copper particle is dissolved under a condition for the polymer dispersing agent (D) as not to be reacted in an oxidizing solution, performing a quantitative analysis using a liquid chromatography or the like, and then measuring the weight ratio (D/P). Here, it is possible to obtain approximately 0.02% by weight regarding a limit of detection for the polymer dispersing agent (D) by such the analysis method.

(ii) Collecting the fine particle (P) obtained in Process 2 as a sample for analysis, extracting the polymer dispersing agent (D) from the fine particles (P) into the solvent by operating such as a solvent extraction or the like, and operating a concentration of such as an evaporation or the like therefor in a case of being required. And then it is possible to perform thereafter using an analysis, such as a liquid chromatography, an X-ray photoelectron spectroscopy (XPS), an Auger electron spectroscopy (AES), or the like, for a specific element (a nitrogen, a sulfur, or the like) in the polymer dispersing agent (D).

(c) Process 3

Process 3 is a process comprising the steps of:

re-dispersing the fine particles (P) obtained in the Process 2 into:

(i) an organic solvent (S1) which contains at least an organic solvent (A) as between 5% and 90% by volume having one amide group, a low boiling point organic solvent (B) as between 5% and 45% by volume having a boiling point of between 20° C. and 100° C. at a normal pressure, and an organic solvent (C) as between 5% and 90% by volume having a boiling point of higher than 100° C. at a normal pressure and comprised of an alcohol and/or a polyhydric alcohol having one or not less than two hydroxyl groups in a molecule thereof;

(ii) an organic solvent (S2) which contains at least the organic solvent (A) as between 5% and 95% by volume having the one amide group, and the organic solvent (C) as between 5% and 95% by volume having the boiling point of higher than 100° C. at the normal pressure and comprised of the alcohol and/or the polyhydric alcohol having the one or not less than the two hydroxyl groups in the molecule thereof; or (iii) the organic solvent (C) having the boiling point of higher than 100° C. at the normal pressure and comprised of the alcohol and/or the polyhydric alcohol having the one or not less than the two hydroxyl groups in the molecule thereof, for obtaining the fine particle dispersion wherein the fine particles (P) are dispersed into the organic solvent.

Here, regarding the mixing ratio for individual solvent types regarding the above mentioned organic solvent (S2), the organic solvent (S2), or the like, it is based on a volume ratio for the individual solvents before mixing the solvents (hereinafter, ditto regarding the second embodiment).

(4) Regarding the Organic Solvent or the Like According to the Present Invention (4-1) Regarding the Organic Solvent (S1)

The organic solvent (S1) is the organic solvent which contains at least the organic solvent (A) as between 5% and 90% by volume, the organic solvent (B) as between 5% and 45% by volume, and the organic solvent (C) as between 5% and 90% by volume.

The organic solvent (A) is contained as between 5% and 90% by volume in the organic solvent (S1), which improves the dispersibility and the storage stability in such the mixed organic solvent. Moreover, it has a function to improve the substrate adherence in a case where it is baked on the substrate at a state of containing the above mentioned fine particle of metal or the like.

The organic solvent (B) is contained as between 5% and 45% by volume in the organic solvent (S1), that it is considered to reduce an interaction between the solvent molecules in such the mixed organic solvent, and to have a function to improve an affinity of the dispersed particle for the solvent. Such the effect is expected regarding a solvent having a lower boiling point in general, and it is desirable to use an organic solvent in particular having a boiling point of not higher than 100° C. at a normal pressure, because it is able to obtain the effect to reduce the effective interaction between the solvent molecules. And it is preferable to use the ether based compound (B1) in particular among the organic solvents (B) because it has a larger effect for reducing such the interaction between the solvent molecules.

Moreover, by using the organic solvents (B), it is able to shorten extremely a period for agitation in a case of performing a preparation of the fine particle dispersion with irradiating a ultrasonic wave or the like. For example, it is possible to shorten to be one second thereof approximately. Further, it is possible to re-disperse easily even in a case where the fine particles become an agglomerated state once, if the organic solvent (B) exists in the mixed organic solvent.

The organic solvent (C) is contained as between 5% and 90% by volume in the organic solvent (S1), which improves the dispersibility in the mixed organic solvent, and then it has an advantage in particular as mentioned below. That is to say, the mixed organic solvent containing the organic solvent (A) and the organic solvent (B) has an excellent dispersibility by the agitation therefor, however, there is a tendency generally that the fine particles in the organic solvent are connected together as time passes. On the contrary, in a case where the organic solvent (C) is existed in the mixed organic solvent, it becomes possible to design a further stability in a longer period for the dispersing agent with suppressing effectively such the connection. Moreover, in the case where the organic solvent (C) is existed in the mixed organic solvent, it becomes possible to improve a uniformity of a sintered layer in a case where such the fine particle dispersion is coated and sintered on a substrate. Further, it becomes able to obtain the baked layer having a higher electrical conductivity due to functioning of a reduction promoting effect for an oxide coated layer which the organic agent (C) has.

Still further, a meaning that the organic solvent (S1) is the organic solvent which contains at least the organic solvent (A) as between 5% and 90% by volume, the organic solvent (B) as between 5% and 45% by volume and the organic solvent (C) as between 5% and 90% by volume is that the organic solvent (S1) may be mixed to be as 100% by volume with the above mentioned mixing ratio using the organic solvent (A), the organic solvent (B) and the organic solvent (C), and also that another organic solvent component may be mixed within a range of the above mentioned mixing ratio and also within a range as not lose the advantage of the present invention. In such a case, it is desirable to contain the component as not less than 90% by volume, which is comprised of the organic solvent (A), the organic solvent (B) and the organic solvent (C), and further preferable to contain as not less than 95% by volume.

Still further, in a case of mixing any other organic solvent components than the above mentioned ones, it is desirable to use a polar organic solvent, such as tetrahydrofuran, diglyme, ethylene carbonate, propylene carbonate, sulfolane, dimethylsulfoxide, or the like.

Still further, the organic solvent (S1), which contains the organic solvent (A), the organic solvent (B) and the organic solvent (C) with a predetermined rate respectively, is superior in stability of the dispersibility. And then it becomes able to obtain a baked layer having an improved uniformity thereof and a higher electrical conductivity in a case where a fine particle dispersion, with which the organic solvent (S1) is used, is coated onto a substrate and then dried and sintered.

Still further, it is more desirable for a mixing amount of the organic solvent (A) in the mixed organic solvent (S1) to be as between 50% and 90% by volume for functioning effectively the above mentioned aspects, and then it is further preferable to be as between 60% and 80% by volume. Still further, it is more desirable for a mixing amount of the organic solvent (B) to be as between 5% and 40% by volume, and then it is further preferable to be as between 10% and 30% by volume. Furthermore, it is more desirable for a mixing amount of the organic solvent (C) to be as between 5% and 45% by volume, and then it is further preferable to be as between 10% and 30% by volume.

(4-2) Regarding the Organic Solvent (S2)

The organic solvent (S2) is the organic solvent which contains at least the organic solvent (A) as between 5% and 95% by volume having one amide group, and the organic solvent (C) as between 5% and 95% by volume having the boiling point of higher than 100° C. at a normal pressure and comprised of an alcohol and/or a polyhydric alcohol having one or not less than two hydroxyl groups in the molecule thereof.

The organic solvent (A) is contained as between 5% and 95% by volume in the organic solvent (S2), which improves the dispersibility and the storage stability in such the mixed organic solvent. Moreover, it has a function to improve the substrate adherence in a case where it is baked on the substrate at a state of containing the above mentioned fine particle of metal or the like.

The organic solvent (C) is contained as between 5% and 95% by volume in the organic solvent (S2), which improves the dispersibility in the mixed organic solvent. Here, there is a tendency generally that the fine particles in the organic solvent become connected together as time passes. On the contrary, in a case where the organic solvent (C) is existed in the mixed organic solvent, it becomes possible to design a further stability in a longer period for the dispersing agent with suppressing effectively such the connection. Moreover, in the case where the organic solvent (A) and the organic solvent (C) are existed in the mixed organic solvent, it becomes able to obtain a baked layer having a higher electrical conductivity even at a lower baking temperature in a case where the fine particle dispersion thereof is coated and sintered onto a substrate.

Further, a meaning that the organic solvent (S2) is the organic solvent which contains at least the organic solvent (A) as between 5% and 95% by volume and the organic solvent (C) as between 5% and 95% by volume is that the organic solvent (S2) may be mixed to be as 100% by volume with the above mentioned mixing ratio using the organic solvent (A) and the organic solvent (C), and also that another organic solvent component may be mixed within a range of the above mentioned mixing ratio and also within a range as not lose the advantage of the present invention. In such a case, it is desirable to contain the component as not less than 90% by volume, which is comprised of the organic solvent (A) and the organic solvent (C), and further preferable to contain as not less than 95% by volume.

Still further, in a case of mixing any other organic solvent components than the above mentioned ones, it is able to use the polar organic solvent, such as tetrahydrofuran, diglyme, ethylene carbonate, propylene carbonate, sulfolane, dimethylsulfoxide, or the like.

Still further, such the organic solvent (S1) and the organic solvent (S2) becomes to be organic solvents that are superior in dispersibility in a case where that are used for forming a pattern using an ink-jet method.

Still further, it is more desirable for a mixing amount of the organic solvent (A) in the mixed organic solvent (S2) to be as between 50% and 90% by volume for functioning effectively the above mentioned aspects, and then it is further preferable to be as between 60% and 80% by volume. Furthermore, it is more desirable for a mixing amount of the organic solvent (C) to be as between 10% and 50% by volume, and then it is further preferable to be as between 20% and 40% by volume.

(4-3) Regarding the Organic Solvent (C)

The organic solvent (C) has the boiling point of higher than 100° C. at the normal pressure and is comprised of the alcohol and/or the polyhydric alcohol having one or not less than two hydroxyl groups in the molecule thereof. Moreover, it is characterized in that it is possible to bake at a lower temperature comparing to conventional fine particle dispersions, because there is no existence of the polymer dispersing agent (D) or the concentration thereof is quite low even if it exists, though it has a little inferior in dispersibility comparing to the above mentioned organic solvent (S1) and the organic solvent (S2).

Exemplary mention regarding the organic solvent (C) will be described in detail later. Here, it is more desirable to be a sort of glycol, such as ethylene glycol, diethylene glycol, or the like, among the alcohol and/or the polyhydric alcohol, and then it is further preferable in particular to be ethylene glycol.

Moreover, it is possible to use any other organic solvent with mixing to the organic solvent (C) as far as it functions effectively the above mentioned aspects. In such a case, it is desirable for a mixing amount of such the organic solvent to be as not more than 10% by volume, and it is further preferable therefor to be as not more than 5% by volume.

(4-4) Regarding Components of the Organic Solvent or the like According to the Present Invention Examples of the above mentioned organic solvent (A), the organic solvent (B) and the organic solvent (C) are described in detail below.

The organic solvent (A) is a chemical compound having an amide group (—CONH—), and it is desirable in particular to be a type having a higher relative dielectric constant. Here, it is able to provide as examples for such the organic solvent (A), such as N-methylacetamide (191.3 at 32° C.), N-methylformamide (182.4 at 20° C.), N-methylpropanamide (172.2 at 25° C.), formamide (111.0 at 20° C.), N,N-dimethylacetamide (37.78 at 25° C.), 1,3-dimethyl-2-imidazolidinone (37.6 at 25° C.), N,N-dimethylformamide (36.7 at 25° C.), 1-methyl-2-pyrolidone (32.58 at 25° C.), hexamethylphosphorictriamide (29.0 at 20° C.), 2-pyrrolidinone, ϵ-caprolactam, acetamide, or the like. And then it is able to use with mixing thereof as well. Here, the number in each of parentheses after each name of the above mentioned chemical compounds having the amide group designates a relative dielectric constant at a measured temperature for the individual solvent respectively. Moreover, it is able to use preferably N-methylacetamide, N-methylformamide, formamide, acetamide, or the like, among those, due to the relative dielectric constant of not less than 100. Further, in a case of a solid state at a normal temperature for such as N-methylacetamide (a melting point: between 26° C. and 28° C.), it is able to use by mixing with another solvent to become a liquid state at an operation temperature.

The organic solvent (B) is an organic compound having a boiling point within a range of between 20° C. and 100° C. at a normal pressure.

In a case where the boiling point at the normal pressure is lower than 20° C., a component of the organic solvent (B) becomes easily volatilized in a case where a particle dispersing containing the organic solvent (B) is stored at a normal temperature, and then a solvent composition may be changed. While, in a case where the boiling point at the normal pressure is not higher than 100° C., it is expected that an interaction between the solvent molecules becomes to be reduced due to adding such the solvent, and then an effect becomes to be functioned effectively for further improving the dispersibility of the fine particles.

Moreover, it is able to exemplary mention for the organic solvent (B), such as an ether based compound (B1) expressed by a general form $R^1$—O—$R^2$ ($R^1$ and $R^2$ are alkyl groups individually, and a carbon number is between one and four respectively), an alcohol (B2) expressed by a general form $R^3$—OH ($R^3$ is an alkyl group, and a carbon number is between one and four), a ketone based compound (B3) expressed by a general form $R^4$—C(=O)—$R^5$ ($R^4$ and $R^5$ are alkyl groups individually, and a carbon number is one or two respectively), and an amine based compound (B4) expressed by a general form $R^6$—(N—$R^7$)—$R^8$ ($R^6$, $R^7$ and $R^8$ are alkyl groups or a hydrogen atoms individually, and a carbon number is between zero and two respectively).

Hereinafter, the above mentioned organic solvent (B) is exemplary mentioned. Here, the number in each of parentheses after each name of chemical compounds designates a boiling point thereof at the normal pressure.

Here, it is able to exemplary mention for the above mentioned ether based compound (B1), such as diethyl ether (35° C.), methyl propyl ether (31° C.), dipropyl ether (89° C.), diisopropyl ether (68° C.), methyl-t-butyl ether (55.3° C.), t-amyl methyl ether (85° C.), divinyl ether (28.5° C.), ethyl vinyl ether (36° C.), aryl ether (94° C.), or the like.

Moreover, it is able to exemplary mention for the above mentioned alcohol (B2), such as methanol (64.7° C.), ethanol (78.0° C.), 1-propanol (97.15° C.), 2-propanol (82.4° C.), 2-butanol (100° C.), 2-methyl 2-propanol (83° C.), or the like.

Further, it is able to exemplary mention for the above mentioned ketone based compound (B3), such as acetone (56.5° C.), methyl ethyl ketone (79.5° C.), diethyl ketone (100° C.), or the like.

Still further, it is able to exemplary mention for the above mentioned amine based compound (B4), such as triethylamine (89.7° C.), diethylamine (55.5° C.), or the like.

Still further, the organic solvent (C) is an organic compound having a boiling point of higher than 100° C. at a normal pressure and comprised of an alcohol and/or a polyhydric alcohol having one or not less than two hydroxyl groups in the molecule thereof. In such a case, the alcohol and the polyhydric alcohol therefor both have the boiling points of higher than 100° C. at the normal pressure. Still further, it is desirable to use an alcohol having a carbon number of not less than five, and a polyhydric alcohol having a carbon number of not less than two, and then it is desirable to use a liquid state type at a normal temperature, and a type having a relative dielectric constant as high as not less than 10 for example.

Still further, it is able to exemplary mention for the organic solvent (C), such as ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanediol, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, or the like.

Still further, it is possible to use a sort of sugar alcohol as well, such as D-threitol, erythritol, pentaerythritol, pentitol, hexitol, or the like, wherein xylitol, ribitol and arabitol are included in pentitol, and mannitol, sorbitol, dulcitol and the like, are included in the above mentioned hexitol. Still further, it is possible to use saccharides as well, such as glyceric aldehyde, dioxy-acetone, threose, erythrulose, erythrose, arabinose, ribose, ribulose, xylose, xylulose, lyxose, glucose, fructose, mannose, idose, sorbose, gulose, talose, tagatose, galactose, allose, altrose, lactose, xylose, arabinose, isomaltose, gluco-heptose, heptose, maltotriose, lactulose, trehalose, or the like.

Furthermore, among the above mentioned sort of alcohol, it is more desirable to use the polyhydric alcohol having the hydroxyl groups of not less than two in the molecule thereof, and then it is further preferable to use ethylene glycol and glycerin in particular.

(5) Regarding the Re-Dispersion into the Organic Solvent or the Like According to the Present Invention As physical method for re-dispersing the above mentioned fine particles (P) into the organic solvent (S1), the organic solvent (S2), or the organic solvent (C), it is able to adopt the heretofore known agitation method to apply a physical energy to a secondary particle. And then it is desirable to adopt a method of irradiating an ultrasonic wave.

Regarding a period for irradiating the above mentioned ultrasonic wave, there is no limitation in particular, and it is possible to select arbitrarily. As described below in the example 1 for example, there is a tendency that the longer the irradiation period, the smaller the mean secondary agglomerated size becomes, in a case of setting arbitrarily the period of irradiating the ultrasonic wave as between five minutes and sixty minutes.

(2) A Second Embodiment According to the Fine Particle Dispersion

The fine particle dispersion as the second embodiment according to the present invention is characterized in that a fine particle dispersion, in which fine particles (P) comprised of one type or not less than two types of a metal, an alloy, and a metallic compound, having a mean particle diameter of between 1 nm and 150 nm for primary particles are dispersed in an organic solvent, wherein a weight ratio of (D/P) between a polymer dispersing agent (D) coating a surface of the fine particle (P) and the fine particles (P) in the dispersion is less than 0.001, and such the organic solvent is any one of:

(i) an organic solvent (S1) which contains at least an organic solvent (A) as between 5% and 90% by volume having an amide group, a low boiling point organic solvent (B) as between 5% and 45% by volume having a boiling point of between 20° C. and 100° C. at a normal pressure, and an organic solvent (C) as between 5% and 90% by volume having a boiling point of higher than 100° C. at a normal pressure and comprised of an alcohol and/or a polyhydric alcohol having one or not less than two hydroxyl groups in a molecule thereof;

(ii) an organic solvent (S2) which contains at least the organic solvent (A) as between 5% and 95% by volume having the amide group, and the organic solvent (C) as between 5% and 95% by volume having the boiling point of higher than 100° C. at the normal pressure and comprised of the alcohol and/or the polyhydric alcohol having the one or not less than the two hydroxyl groups in the molecule thereof; or (iii) the organic solvent (C) having the boiling point of higher than 100° C. at the normal pressure and comprised of the alcohol and/or the polyhydric alcohol having the one or not less than the two hydroxyl groups in the molecule thereof.

(1) Regarding the Metal, the Alloy, and the Metallic Compound

The metal, the alloy, and the metallic compound that are available to be used for the present invention are similar to that described in the first embodiment according to the present invention. And then it is preferable to use any one type or not less than two types of metals selected from Cu, Ag, Au, or the like among the above mentioned metals, or an alloy comprised of not less than two types of such the metals.

(2) Regarding the Mean Particle Diameter of the Primary Particles for the Fine Particle (P)

The mean particle diameter of the primary particles for the fine particle (Pc) produced by the liquid phase reduction of the above mentioned metal ion is between 1 nm and 150 nm, however, it is preferable to have the diameter of between 1 nm and 100 nm from viewpoint for practice. Here, a primary particle diameter means a diameter of the primary particle for individual fine particles of metal or the like comprising a secondary particle. It is able to measure such the primary particle diameter using a transmission electron microscope. Moreover, the mean particle diameter means a number-average particle diameter of the fine particles of metal or the like.

Further, the fine particle (P) according to the present invention forms a secondary aggregate as a soft aggregate, in which fine particles attract each other by a weak force that it is possible to re-disperse, wherein the primary particle diameter is between 1 nm and 150 nm in the organic solvent. Still further, it is able to measure a secondary agglomerated size thereof using a grain size distribution measurement equipment of a dynamic light scattering type. Furthermore, it becomes able to obtain a fine particle dispersion having a higher particle dispersibility (a smaller secondary agglomerated size) by dispersing the fine particle (P) according to the present invention into the organic solvent (S1), the organic solvent (S2), or the organic solvent (C).

(3) Regarding the Weight Ratio of (D/P) between the Polymer Dispersing Agent (D) and the Fine Particles (P) as Less than 0.001

The polymer dispersing agent (D) is added to improve the particle dispersibility of the fine particle when the fine particle such as metal is precipitated by the liquid phase reduction in the aqueous solution. However, in case that the added polymer dispersing agent (D)remains in the fine particle dispersion as it is, it deteriorates the electrical conductivity and requires a higher baking temperature at the time when the fine particle dispersion is placed on the substrate and baked.

For avoiding such the inconvenience, as described in Process 2 according to the first embodiment for example, it is desirable to design the weight ratio of (D/P) between the polymer dispersing agent (D) coating the fine particle (P) and the fine particles (P) as less than 0.001, by adding the aggregation accelerator (F) after finishing the reductive reaction, and then by removing the polymer dispersing agent (D) sufficiently.

(4) Regarding the Organic Solvent According to the Second Embodiment

The organic solvent (S1), the organic solvent (S2) and the organic solvent (C) according to the second embodiment regarding the present invention is similar to that described in the first embodiment according to the present invention.

(5) Regarding a Shape of the Fine Particle Comprised of the Metal or the Like

It is desirable to design a mean particle diameter (P) of the fine particles (P) dispersed into the organic solvent (S1), the organic solvent (S2) and the organic solvent (C) as between 1 nm and 150 nm, according to taking into consideration regarding a purpose of use of the metallic thin film, the thin metallic wire, or the like. Moreover, it is able to form such the fine particle by using the reductive reaction in the liquid phase for the metal ion, or the heretofore known reductive reaction, as described in the first embodiment. Further, the organic solvent (S1), the organic solvent (S2) or the organic solvent (C) according to the present invention are superior in dispersibility of the fine particles (P). And then it is possible to design easily the mean secondary agglomerated size of the secondary agglomerated particles comprised of such the fine particles (P) to be as not larger than 500 nm, or to be preferably as not larger than 300 nm.

(6) Regarding the Fine Particle Dispersion

It is able to confirm that the weight ratio of (D/P) between the polymer dispersing agent (D) coating the surface of the fine particle (P) and the fine particle (P) is less than 0.001, by the following method of (i), or (ii) for example.

(i) Collecting the fine particle dispersion, separating the fine particle (P) from the fine particle dispersion by operating such as the centrifugal separation or the like, performing a preparation of a solution wherein a copper particle is dissolved under a condition for the polymer dispersing agent (D) as not to be reacted in an oxidizing solution, performing a quantitative analysis using the liquid chromatography or the like, and then measuring the weight ratio (D/P). Here, it is possible to obtain approximately 0.02% by weight regarding the limit of detection for the polymer dispersing agent (D) by such the analysis method.

(ii) Collecting the fine particle dispersion, separating the fine particle (P) from the fine particle dispersion by operating such as the centrifugal separation or the like, extracting the polymer dispersing agent (D) from the fine particles (P) into the solvent by operating such as the solvent extraction or the like, and operating a concentration of such as the evaporation or the like therefor in a case of being required. And then it is possible to perform thereafter using an analysis, such as the liquid chromatography, the X-ray photoelectron spectroscopy (XPS), the Auger electron spectroscopy (AES), or the like, for a specific element (nitrogen, sulfur, or the like) in the polymer dispersing agent (D).

Moreover, it is possible to arrange the fine particle dispersion on a substrate, wherein the fine particles (P), in which the mean particle diameter for the primary particles is between 1 nm and 150 nm are dispersed into the organic solvent (S1), the organic solvent (S2), or the organic solvent (C), by using the ink-jet method at a relatively lower temperature of approximately 190° C. for example, without using any reducing gas, such as a hydrogen gas or the like. And then it is possible to form a thin film containing metal or a thin wire containing metal, that have electrical conductivities, by baking therefor after drying it.

Further, there is no limitation in particular regarding the above mentioned substrate, and then it is able to use a glass, a polyimide, or the like. Still further, the drying and the baking are performed under an inert gaseous atmosphere, such as argon or the like. Still further, a drying condition is approximately for between fifteen minutes and thirty minutes at between 100° C. and 200° C. for example, which depends of course a polar solvent to be used. Still further, a baking condition is approximately for between twenty minutes and forty minutes at between 190° C. and 250° C. for example, which depends of course a coating thickness to be applied, and preferably for between twenty minutes and forty minutes approximately at between 190° C. and 220° C.

Still further, the thin film containing metal or the thin wire containing metal obtained in such a way have the electrical conductivities. And then it is possible to achieve a value of electrical resistance therefor as not higher than 1.0 Ωcm, for example to be between $1.0 \times 10^{-5}$ Ωcm and $1.0 \times 10^{-4}$ Ωcm. Furthermore, the above mentioned thin film containing metal is superior in substrate adherence as well.

EXAMPLES

The present invention will be described in detail below with using the examples, however, the present invention is not limited to the description regarding the examples as described below.

Here, mean particle diameter of the primary particles in the fine particle dispersion is evaluated by an observation using a transmission electron microscope (produced by JEOL Ltd., model: JEM-3010), and the secondary agglomerated size thereof is evaluated by the grain size distribution measurement using a grain size distribution measurement equipment of a dynamic light scattering type (produced by Sysmex Corporation, model: (Zetasizer Nano Series) Nano-ZS), regarding the below described examples and the comparative examples.

Example 1

A confirmation regarding a concentration of the polymer dispersing agent contained in the fine particles of metal or the like according to the present invention is performed as below.

(1) Regarding the Preparation of the Fine Particle Dispersion of Copper

First, a fine particle of copper, which is covered by a polymer dispersing agent, is prepared using the following method.

As a material for a fine particle of copper, a cupric acetate aqueous solution as 10 ml is prepared, wherein cupric acetate $((CH_3COO)_2Cu \cdot 1H_2O)$ as 0.2 g is dissolved in an aqua distillata as 10 ml. And, as a reducing agent for a metal ion, a sodium borohydride aqueous solution as 100 ml is prepared, wherein sodium borohydride is dissolved in an aqua distillata to be a concentration as 5.0 mol/liter (1). Moreover, as a polymer dispersing agent, polyvinylpyrrolidone (PVP, the number-average molecular weight of 3500 approximately) is further added as 0.5 g into the above mentioned sodium borohydride aqueous solution, and then it is dissolved by agitating therefor.

Further, 10 ml of the above mentioned cupric acetate aqueous solution is dropped into the aqueous solution in a nitrogen gaseous atmosphere, wherein the above mentioned reducing agent and the polymer dispersing agent are dissolved therein. And then such the reductive reaction solution is reacted with agitating very well for approximately sixty minutes. As a result, it becomes able to obtain the fine particle dispersion, wherein the fine particles of copper having the mean particle diameter of between 5 nm and 10 nm for the primary particles are dispersed in the aqueous solution.

Next, 5 ml of chloroform as the aggregation accelerator is added into 100 ml of the dispersion obtained using the above mentioned method, wherein the fine particles of copper are dispersed, and then it is still stood after agitating very well for a couple of minutes. Next, an aqueous phase as a reaction liquid is supplied to a centrifugal separator, and then the fine particles of copper are separated and collected therefrom. Next, the obtained fine particles of copper and 30 ml of an aqua distillata are put into a test tube, and then it is agitated very well using the ultrasonic homogenizer. Next, it is washed three times by performing an aqua cleaning for collecting a particle component using the centrifugal separator. Next, the obtained fine particles of copper and 30 ml of 1-butanol are put into the same test tube, and then it is agitated very well. Next, it is washed three times by performing an alcohol cleaning for collecting fine particles of copper using the centrifugal separator. According to the above mentioned processes, it becomes able to obtain the fine particles of copper to be dispersed into the final dispersing solvent.

(2) An Assay Regarding the Existence of the Polymer Dispersing Agent

An assay is performed regarding the polymer dispersing agent coating the surface of the obtained fine particles of copper. First, an eluent, which is prepared by mixing 0.2 M of a nitric acid aqueous solution, 0.2 M of a hydrochloric acid aqueous solution and methanol with a ratio of 1:1:2, is put into the fine particles of copper obtained in the above mentioned process, and then the copper particle component is dissolved therein. Next, the obtained solution is neutralized using a proper amount of a sodium hydroxide aqueous solution. Moreover, a content of the polymer dispersing agent component using a gel permeation chromatography (GPC) produced by Showa Denko K.K., a detector: Shodex RI SE-61 and a column: Tosoh TSKgel G3000PWXL. As a result, there is not at all detected the polymer dispersing agent component (polyvinylpyrrolidone) which is used therefor. Here, the detection limit of such the measurement equipment is 0.02% by weight.

According to the experimental result and the detection sensitivity of the measurement equipment, it becomes able to confirm that the amount of the polymer dispersing agent (D) attached onto the fine particle of copper obtained by using the present producing method is less than 0.001 at the most as the weight ratio of (D/P) with the fine particles (P).

Example 2, Comparative Example 2

Next, there are performed evaluations as described below regarding the mean particle diameter of the primary particles (the primary particle size) and the mean grain size distribution (the secondary agglomerated size) in the copper fine particle dispersion.

The collected fine particles of copper described in Example 1 is dispersed into: ethylene glycol as one example for the organic solvent (C) according to the present invention; a solvent wherein ethylene glycol and N-methylacetamide are mixed with a ratio by volume of 95:5, 80:20, 50:50, 20:80 and 5:95 respectively, as examples for the organic solvent (S2); and 10 ml of a solvent wherein the ethylene glycol, N-methylacetamide and diethyl ether are mixed with a ratio by volume of 90:5:5, 80:10:10, 5:90:5, 40:40:20, 10:45:45 and 50:10:40 respectively, as examples for the organic solvent (S1). And then the fine particle dispersions according to the present invention are obtained by applying an ultrasonic wave vibration into the individual dispersion using an ultrasonic homogenizer for approximately thirty minutes and sixty minutes respectively. Moreover, the above mentioned fine particles of copper are dispersed into respectively: 10 ml of an aqua distillata as Comparative example 2-1; and 10 ml of a solvent wherein ethylene glycol, N-methylacetamide and diethyl ether are mixed with a ratio by volume of 20:20:60 as Comparative example 2-2. And then the fine particle dispersions are prepared as well, by applying the ultrasonic wave vibration into the individual dispersions using the ultrasonic homogenizer.

(2) An Assay Regarding a Dispersion Efficiency of the Fine Particle Dispersion of Copper The measurement results are shown in Table 1 and 2 regarding the mean particle diameter of the primary particles in the fine particle dispersion and the secondary agglomerated size thereof. As a result, it is confirmed that it becomes able to obtain the fine particle dispersion which is superior in dispersibility (having smaller secondary agglomerated size) by dispersing the fine particles of copper according to the present invention into the organic solvent (C). Moreover, by dispersing the fine particles of copper according to the present invention into the organic solvent (S2), it is confirmed that it becomes able to obtain the fine particle dispersion which is further superior in dispersibility. Further, by dispersing the fine particles of copper according to the present invention into the organic solvent (S1), it is confirmed that it becomes able to obtain the fine particle dispersion which is more superior in dispersibility to the others.

These results are shown in Tables 1 and 2.

Example 3, Comparative Example 3

The fine particle dispersion is arranged onto the substrate, and then an evaluation of an electrical conductivity is performed regarding the baked layer obtained by drying and baking therefor.

First, the fine particles of copper prepared using the method described in Example 1 is dispersed into: ethylene glycol as one example for the organic solvent (C) according to the present invention; a solvent wherein ethylene glycol and N-methylacetamide are mixed with a ratio by volume of 95:5, 80:20, 50:50, 20:80 and 5:95 respectively, as examples for the organic solvent (S2); and 10 ml of a solvent wherein ethylene glycol, N-methylacetamide and diethyl ether are mixed with a ratio by volume of 90:5:5, 80:10:10, 5:90:5, 40:40:20, 10:45:45 and 50:10:40 respectively, as examples for the organic solvent (S1). And then the fine particle dispersions according to the present invention are obtained by applying an ultrasonic wave vibration for approximately sixty minutes into the individual dispersions using an ultrasonic homogenizer respectively.

Moreover, as Comparative example 3, there are prepared a fine particle dispersion, wherein the similar fine particles of copper are dispersed into the aqua distillata, and the copper nano particle solution produced by ULVAC Inc. (the product

TABLE 1

|  |  | Example number | | | | | |
| --- | --- | --- | --- | --- | --- | --- | --- |
|  |  | 2-1 | 2-2 | 2-3 | 2-4 | 2-5 | 2-6 |
| (1) Solvent mixing ratio |  |  |  |  |  |  |  |
| Ethylene glycol | (% by volume) | 100 | 95 | 80 | 50 | 20 | 5 |
| N-methylacetamide | (% by volume) | 0 | 5 | 20 | 50 | 80 | 95 |
| Diethyl ether | (% by volume) | 0 | 0 | 0 | 0 | 0 | 0 |
| Aqua distillata | (% by volume) | — | — | — | — | — | — |
| (2) Evaluation result |  |  |  |  |  |  |  |
| Mean primary particle size | (nm) | 20 | 20 | 20 | 15 | 15 | 15 |
| Mean secondary agglomerated size |  |  |  |  |  |  |  |
| Ultrasonic wave irradiation time: 30 min | (nm) | 210 | 180 | 175 | 165 | 150 | 155 |
| Ultrasonic wave irradiation time: 60 min | (nm) | 160 | 125 | 120 | 115 | 100 | 110 |

TABLE 2

|  |  | Example number | | | | | | Comparative example number | |
| --- | --- | --- | --- | --- | --- | --- | --- | --- | --- |
|  |  | 2-7 | 2-8 | 2-9 | 2-10 | 2-11 | 2-12 | 2-1 | 2-2 |
| (1) Solvent mixing ratio |  |  |  |  |  |  |  |  |  |
| Ethylene glycol | (% by volume) | 90 | 80 | 5 | 40 | 10 | 50 | 0 | 20 |
| N-methylacetamide | (% by volume) | 5 | 10 | 90 | 40 | 45 | 10 | 0 | 20 |
| Diethyl ether | (% by volume) | 5 | 10 | 5 | 20 | 45 | 40 | 0 | 60 |
| Aqua distillata | (% by volume) | — | — | — | — | — | — | 100 | — |
| (2) Evaluation result |  |  |  |  |  |  |  |  |  |
| Mean primary particle size | (nm) | 20 | 20 | 15 | 20 | 20 | 20 | 20 | 20 |
| Mean secondary agglomerated size |  |  |  |  |  |  |  |  |  |
| Ultrasonic wave irradiation time: 30 min | (nm) | 140 | 130 | 135 | 120 | 145 | 155 | 650 | dispersion solvent |
| Ultrasonic wave irradiation time: 60 min | (nm) | 115 | 120 | 110 | 115 | 125 | 130 | 610 | phase separation | name: Cu Nano-Metal-Ink [Cu1T]). Next, the above mentioned each of the fine particle dispersions is coated on a glass substrate (size: 2 cm×2 cm), and then it is dried for approximately thirty minutes in a nitrogen atmosphere at a temperature of 140° C. Moreover, a baked layer is obtained by performing a heat treatment for approximately one hour in a nitrogen atmosphere at a temperature of 180° C., 190° C., 210° C., 250° C. and 300° C. respectively. Further, for the obtained baked layer, an electrical resistance thereof is measured using a direct current four-terminal method (the used measurement device: the digital multimeter DMM2000 type (the four-terminal electrical resistance measurement mode) produced by Keithley Instruments, KK).

The measurement results are shown in Table 3 and 4. According to Table 3 and 4, it becomes clear for the fine particle dispersion of copper obtained according to the present invention that it is able to obtain the baked layer having the excellent electrical conductivity by performing the heat treatment at the temperature of not less than 190° C. in the nitrogen atmosphere after coating onto the glass substrate and drying therefor.

TABLE 3

| Example number | | 3-1 | 3-2 | 3-3 |
|---|---|---|---|---|
| (1) Solvent mixing ratio | | | | |
| Ethylene glycol | (% by volume) | 100 | 95 | 80 |
| N-methylacetamide | (% by volume) | 0 | 5 | 20 |
| Diethyl ether | (% by volume) | 0 | 0 | 0 |
| Aqua distillata | (% by volume) | — | — | — |
| (2) Evaluation result (electrical resistance) | | | | |
| Sintering temperature: 180° C. | ($\Omega$cm) | insulative | insulative | insulative |
| Sintering temperature: 190° C. | ($\Omega$cm) | $4.4 \times 10^{-4}$ | $2.2 \times 10^{-4}$ | $2.3 \times 10^{-4}$ |
| Sintering temperature: 210° C. | ($\Omega$cm) | $2.3 \times 10^{-4}$ | $1.1 \times 10^{-4}$ | $9.6 \times 10^{-5}$ |
| Sintering temperature: 250° C. | ($\Omega$cm) | $8.7 \times 10^{-5}$ | $6.7 \times 10^{-5}$ | $6.2 \times 10^{-5}$ |
| Sintering temperature: 300° C. | ($\Omega$cm) | $6.2 \times 10^{-5}$ | $5.8 \times 10^{-5}$ | $5.9 \times 10^{-5}$ |
| Example number | | 3-4 | 3-5 | 3-6 |
| (1) Solvent mixing ratio | | | | |
| Ethylene glycol | (% by volume) | 50 | 20 | 5 |
| N-methylacetamide | (% by volume) | 50 | 80 | 95 |
| Diethyl ether | (% by volume) | 0 | 0 | 0 |
| Aqua distillata | (% by volume) | — | — | — |
| (2) Evaluation result (electrical resistance) | | | | |
| Sintering temperature: 180° C. | ($\Omega$cm) | insulative | insulative | insulative |
| Sintering temperature: 190° C. | ($\Omega$cm) | $1.8 \times 10^{-4}$ | $1.2 \times 10^{-4}$ | $3.5 \times 10^{-4}$ |
| Sintering temperature: 210° C. | ($\Omega$cm) | $8.7 \times 10^{-5}$ | $8.8 \times 10^{-5}$ | $1.6 \times 10^{-4}$ |
| Sintering temperature: 250° C. | ($\Omega$cm) | $6.6 \times 10^{-5}$ | $6.5 \times 10^{-5}$ | $7.2 \times 10^{-5}$ |
| Sintering temperature: 300° C. | ($\Omega$cm) | $5.8 \times 10^{-5}$ | $5.1 \times 10^{-5}$ | $6.0 \times 10^{-5}$ |

* Insulative: not less than $1.0 \times 10^{6}$ ($\Omega$cm)

TABLE 4

| | | Example number | | | | | | Comparative example number | |
|---|---|---|---|---|---|---|---|---|---|
| | | 3-7 | 3-8 | 3-9 | 3-10 | 3-11 | 3-12 | 3-1 | 3-2 |
| (1) Solvent mixing ratio | | | | | | | | | |
| Ethylene glycol | (% by volume) | 90 | 90 | 5 | 40 | 10 | 50 | 0 | Copper |
| N-methylacetamide | (% by volume) | 5 | 10 | 90 | 40 | 45 | 10 | 0 | nano |
| Diethyl ether | (% by volume) | 5 | 10 | 5 | 20 | 45 | 40 | 0 | particle |
| Aqua distillata | (% by volume) | — | — | — | — | | | | |
| (2) Evaluation result (electrical resistance) | | | | | | | | | |
| Sintering temperature: 180° C. | ($\Omega$cm) | insulative | insulative | insulative | insulative | | | | |
| Sintering temperature: 190° C. | ($\Omega$cm) | $2.3 \times 10^{-4}$ | $1.6 \times 10^{-4}$ | $2.7 \times 10^{-4}$ | $9.4 \times 10^{-5}$ | | | | |
| Sintering temperature: 210° C. | ($\Omega$cm) | $1.2 \times 10^{-4}$ | $9.7 \times 10^{-4}$ | $1.2 \times 10^{-4}$ | $7.8 \times 10^{-5}$ | | | | |
| Sintering temperature: 250° C. | ($\Omega$cm) | $7.4 \times 10^{-5}$ | $6.1 \times 10^{-5}$ | $6.6 \times 10^{-5}$ | $5.7 \times 10^{-5}$ | | | | |
| Sintering temperature: 300° C. | ($\Omega$cm) | $6.0 \times 10^{-5}$ | $5.4 \times 10^{-5}$ | $4.9 \times 10^{-5}$ | $8.5 \times 10^{-6}$ | | | | |

TABLE 4-continued

| Aqua distillata | (% by volume) | — | — | 100 | produced by ULVAC, Inc. |
|---|---|---|---|---|---|
| (2) Evaluation result (electrical resistance) | | | | | |
| Sintering temperature: 180° C. | ($\Omega$cm) | $3.2 \times 10^{-4}$ | $5.5 \times 10^{-4}$ | insulative | insulative |
| Sintering temperature: 190° C. | ($\Omega$cm) | $3.2 \times 10^{-4}$ | $5.5 \times 10^{-4}$ | insulative | insulative |
| Sintering temperature: 210° C. | ($\Omega$cm) | $2.4 \times 10^{-4}$ | $3.1 \times 10^{-4}$ | insulative | insulative |
| Sintering temperature: 250° C. | ($\Omega$cm) | $9.5 \times 10^{-5}$ | $1.8 \times 10^{-4}$ | insulative | insulative |
| Sintering temperature: 300° C. | ($\Omega$cm) | $7.6 \times 10^{-5}$ | $8.7 \times 10^{-5}$ | $3.4 \times 10^{-3}$ | insulative |

*Insulative: not less than $1.0 \times 10^{6}$ ($\Omega$cm)

INDUSTRIAL APPLICABILITY

According to the present invention, it becomes able to use widely the fine particle dispersion, wherein the fine particles of metal or the like are dispersed into an organic solvent, for such as an ink-jet ink, an etching resist, a solder resist, a dielectric substance pattern, an electrode (electrically conductive circuit) pattern, a wiring pattern in an electronic component, an electrically conductive paste, an electrically conductive ink, an electrically conductive film, or the like.

What is claimed is:

1. A fine particle dispersion, in which fine particles (P) comprised of one type or not less than two types of a metal, an alloy, and a metallic compound, having a mean particle diameter of between 1 nm and 150 nm for primary particles, are dispersed in an organic solvent,
    wherein a weight ratio of (D/P) between a polymer dispersing agent (D) coating a surface of the fine particle (P) and the fine particles (P) in the dispersion is less than 0.001, and
    the organic solvent is one of:
    (i) an organic solvent (S1) which contains at least an organic solvent (A) as between 10% and 90% by volume having an amide group, a low boiling point organic solvent (B) as between 5% and 45% by volume having a boiling point of between 20° C. and 100° C. at a normal pressure, and an organic solvent (C) as between 5% and 85% by volume having a boiling point of higher than 100° C. at a normal pressure and comprised of an alcohol and/or a polyhydric alcohol having one or not less than two hydroxyl groups in a molecule thereof, said organic solvent (S1) containing a total sum of the organic solvent (A) and the organic solvent (C) more than 90% by volume; or
    (ii) an organic solvent (S2) which contains at least the organic solvent (A) as between 10% and 95% by volume having the amide group, and the organic solvent (C) as between 5% and 80% by volume having the boiling point of higher than 100° C. at the normal pressure and comprised of the alcohol and/or the polyhydric alcohol having the one or not less than the two hydroxyl groups in the molecule thereof, said organic solvent (S2) containing a total sum of the organic solvent (A) and the organic solvent (C) more than 90% by volume.

2. The fine particle dispersion according to claim 1, wherein the polymer dispersing agent (D) is one type or not less than types selected from polyvinylpyrrolidone, polyethyleneimine, polyacrylic acid, carboxymethylcellulose, polyacrylamide, polyvinyl alcohol, polyethylene oxide, starch, and gelatin.

3. The fine particle dispersion according to claim 1, wherein the organic solvent (A) is one type or not less than two types selected from N-methylacetamide, N-methylformamide, N-methylpropanamide, formamide, N,N-dimethylacetamide, 1,3-dimethyl-2-imidazolidinone, N,N-dimethylformamide, 1-methyl-2-pyrrolidone, hexamethylphosphorictriamide, 2-pyrrolidinone, ε-caprolactam, and acetamide.

4. The fine particle dispersion according to claim 1, wherein the organic solvent (B) is one type or not less than two types selected from an ether based compound (B1) expressed by a general form $R^1$—O—$R^2$($R^1$ and $R^2$ are alkyl groups individually having a carbon number between one and four respectively), an alcohol (B2) expressed by a general form $R^3$—OH($R^3$ is an alkyl group having a carbon number between one and four), a ketone based compound (B3) expressed by a general form $R^4$—C(=O)—$R^5$($R^4$ and $R^5$ are alkyl groups individually having a carbon number one or two respectively), and an amine based compound (B4) expressed by a general form $R^6$—(N—$R^7$)—$R^8$ ($R^6$, $R^7$ and $R^3$ are alkyl groups or a hydrogen atoms individually having a carbon number between zero and two respectively).

5. The fine particle dispersion according to claim 1, wherein the organic solvent (C) is one type or not less than two types selected from ethylene glycol, diethylene glycol, 1,2-propanediol, 1,3-propanediol, 1,2-butanediol, 1,3-butanediol, 1,4-butanediol, 2-butene-1,4-diol, 2,3-butanediol, pentanedial, hexanediol, octanediol, glycerol, 1,1,1-trishydroxymethylethane, 2-ethyl-2-hydroxymethyl-1,3-propanediol, 1,2,6-hexanetriol, 1,2,3-hexanetriol, 1,2,4-butanetriol, threitol, erythritol, pentaerythritol, pentitol, and hexitol.

6. The fine particle dispersion according to claim 1, wherein the metal is one type or not less than two types selected from copper, silver, gold, nickel, cobalt, iron, zinc, tin, aluminum, bismuth, platinum, rhodium, palladium, ruthenium, manganese, chromium, vanadium, and titanium, the alloy is an alloy comprised of not less than two types of the metals, and the metallic compound is an oxide of the metal and the alloy.

* * * * *